(12) United States Patent  
Zhang et al.

(10) Patent No.: US 12,205,003 B2  
(45) Date of Patent: Jan. 21, 2025

(54) DATA PROCESSING METHOD AND APPARATUS, AND RELATED PRODUCT

(71) Applicant: SHANGHAI CAMBRICON INFORMATION TECHNOLOGY CO., LTD, Shanghai (CN)

(72) Inventors: Yao Zhang, Shanghai (CN); Guang Jiang, Shanghai (CN); Xishan Zhang, Shanghai (CN); Shiyi Zhou, Shanghai (CN); Di Huang, Shanghai (CN); Chang Liu, Shanghai (CN); Jiaming Guo, Shanghai (CN)

(73) Assignee: SHANGHAI CAMBRICON INFORMATION TECHNOLOGY CO., LTD, Shanghai (CN)

( * ) Notice: Subject to any disclaimer, the term of this patent is extended or adjusted under 35 U.S.C. 154(b) by 752 days.

(21) Appl. No.: 17/361,633

(22) Filed: Jun. 29, 2021

(65) Prior Publication Data  
US 2022/0083909 A1 Mar. 17, 2022

Related U.S. Application Data

(63) Continuation of application No. PCT/CN2020/111495, filed on Aug. 26, 2020.

(30) Foreign Application Priority Data

Aug. 26, 2019 (CN) .......................... 201910792847.0

(51) Int. Cl.  
*G06N 20/00* (2019.01)  
*G06F 15/78* (2006.01)  
(Continued)

(52) U.S. Cl.  
CPC ......... *G06N 20/00* (2019.01); *G06F 15/7832* (2013.01); *G06N 3/045* (2023.01);  
(Continued)

(58) Field of Classification Search  
CPC .......... G06N 20/00; G06N 3/04; G06N 3/045; H03M 7/3059; H03M 7/6041; H03M 7/70; G06F 15/7832  
(Continued)

(56) References Cited

U.S. PATENT DOCUMENTS 5,052,043 A 9/1991 Gaborski  
6,144,977 A 11/2000 Giangarra et al.  
(Continued)

FOREIGN PATENT DOCUMENTS

CN 1503858 A 6/2004  
CN 1503958 A 6/2004  
(Continued)

OTHER PUBLICATIONS

Chen et al., "DianNao: A Small-Footprint High-Throughput Accelerator for Ubiquitous Machine-Learning, "ASPLOS '14 Proceedings of the 19th international conference on Architectural support for programming languages and operating systems, pp. 269-284, Salt Lake City, Utah, USA—Mar. 1, 2014; available: https://dl.acm.org/citation.cfm?id=2541967.  
(Continued)

*Primary Examiner* — Khai M Nguyen  
(74) *Attorney, Agent, or Firm* — Rimon PC

(57) ABSTRACT

The present disclosure relates to a method, a device, and related products for processing data. In an embodiment of the present disclosure, when processing data related to a neural network, an optimal truncation threshold value for a plurality of pieces of data is determined. The data is truncated through the truncation data threshold, and the plurality of pieces of data is quantized from a high-precision format to a low-precision format. The method in the present disclosure can ensure the precision of data processing as high as possible while reducing the amount of data processing. In (Continued)

addition, the method also helps to significantly reduce the amount of data transmission, thereby greatly accelerating the data exchange among a plurality of computing devices.

19 Claims, 5 Drawing Sheets

(51) Int. Cl.
 *G06N 3/04* (2023.01)
 *G06N 3/045* (2023.01)
 *H03M 7/30* (2006.01)

(52) U.S. Cl.
 CPC ....... *H03M 7/3059* (2013.01); *H03M 7/6041* (2013.01); *G06N 3/04* (2013.01); *H03M 7/70* (2013.01)

(58) Field of Classification Search
 USPC .............................................. 341/50, 51, 87
 See application file for complete search history.

(56) References Cited

U.S. PATENT DOCUMENTS

| | | |
|---|---|---|
| 6,671,796 B1 | 12/2003 | Sudharsanan et al. |
| 6,715,065 B1 | 3/2004 | Ebata et al. |
| 6,931,639 B1 | 8/2005 | Fickemeyer |
| 7,236,995 B2 | 6/2007 | Hinds |
| 7,242,414 B1 | 7/2007 | Thekkath et al. |
| 7,406,451 B2 | 7/2008 | Mrziglod et al. |
| 7,721,128 B2 | 5/2010 | Johns et al. |
| 7,945,607 B2 | 5/2011 | Hinds |
| 8,051,117 B2 | 11/2011 | Lundvall et al. |
| 8,190,664 B2 | 5/2012 | Lundvall et al. |
| 8,560,591 B2 | 10/2013 | Lundvall et al. |
| 8,694,572 B2 | 4/2014 | Samy et al. |
| 8,762,438 B2 | 6/2014 | Lundvall et al. |
| 8,924,455 B1 | 12/2014 | Barman et al. |
| 9,412,366 B2 | 8/2016 | Wilensky et al. |
| 9,916,531 B1 | 3/2018 | Zivkovic et al. |
| 10,187,568 B1 | 1/2019 | Tran et al. |
| 10,224,954 B1 * | 3/2019 | Madduri ................. H03M 7/24 |
| 10,360,304 B1 | 7/2019 | Alvarez et al. |
| 10,427,306 B1 | 10/2019 | Quinlan et al. |
| 10,656,942 B2 | 5/2020 | Madduri et al. |
| 10,929,744 B2 | 2/2021 | Li et al. |
| 2002/0138714 A1 | 9/2002 | Leibholz et al. |
| 2003/0167460 A1 | 9/2003 | Desai et al. |
| 2005/0138327 A1 | 6/2005 | Tabei |
| 2006/0161375 A1 | 7/2006 | Duberstein et al. |
| 2007/0220076 A1 | 9/2007 | Hinds |
| 2008/0148120 A1 | 6/2008 | Seuring |
| 2009/0113186 A1 | 4/2009 | Kato et al. |
| 2009/0125293 A1 | 5/2009 | Lefurgy et al. |
| 2010/0073068 A1 | 3/2010 | Cho et al. |
| 2011/0060587 A1 | 3/2011 | Phillips et al. |
| 2011/0301777 A1 | 12/2011 | Cox et al. |
| 2012/0316845 A1 | 12/2012 | Grey et al. |
| 2013/0054110 A1 | 2/2013 | Sata |
| 2013/0332610 A1 | 12/2013 | Beveridge |
| 2014/0081625 A1 | 3/2014 | Wilensky et al. |
| 2014/0164737 A1 | 6/2014 | Collange et al. |
| 2014/0249814 A1 | 9/2014 | Nakano et al. |
| 2015/0134581 A1 | 5/2015 | Doeding et al. |
| 2015/0370303 A1 | 12/2015 | Krishnaswamy et al. |
| 2016/0026231 A1 | 1/2016 | Ignowski et al. |
| 2016/0054922 A1 | 2/2016 | Awasthi et al. |
| 2016/0124710 A1 | 5/2016 | Lutz et al. |
| 2016/0170866 A1 | 6/2016 | Toualalen et al. |
| 2016/0328645 A1 | 11/2016 | Lin et al. |
| 2016/0328647 A1 | 11/2016 | Lin et al. |
| 2017/0061279 A1 | 3/2017 | Yang et al. |
| 2017/0090956 A1 | 3/2017 | Linsky |
| 2017/0103022 A1 | 4/2017 | Kreinin et al. |
| 2017/0142327 A1 | 5/2017 | Bayani |
| 2017/0161604 A1 | 6/2017 | Craddock et al. |
| 2017/0221176 A1 | 8/2017 | Munteanu et al. |
| 2017/0257079 A1 | 9/2017 | Jain et al. |
| 2017/0262959 A1 | 9/2017 | Lee et al. |
| 2017/0316307 A1 | 11/2017 | Koster et al. |
| 2017/0316312 A1 | 11/2017 | Goyal et al. |
| 2017/0344882 A1 | 11/2017 | Ambrose et al. |
| 2017/0353163 A1 | 12/2017 | Gazneli et al. |
| 2017/0357530 A1 | 12/2017 | Shih et al. |
| 2017/0357910 A1 | 12/2017 | Sommer et al. |
| 2018/0032866 A1 | 2/2018 | Son et al. |
| 2018/0046903 A1 * | 2/2018 | Yao ........................ G06N 3/048 |
| 2018/0088996 A1 | 3/2018 | Rossi et al. |
| 2018/0096243 A1 | 4/2018 | Patil et al. |
| 2018/0107925 A1 | 4/2018 | Choi et al. |
| 2018/0157464 A1 | 6/2018 | Utz et al. |
| 2018/0211152 A1 | 7/2018 | Migacz et al. |
| 2018/0288440 A1 | 10/2018 | Chao |
| 2018/0293517 A1 | 10/2018 | Browne et al. |
| 2018/0300931 A1 | 10/2018 | Vembu et al. |
| 2018/0322391 A1 | 11/2018 | Wu et al. |
| 2018/0357541 A1 | 12/2018 | Chen et al. |
| 2018/0367729 A1 | 12/2018 | Parasnis et al. |
| 2018/0373976 A1 | 12/2018 | Woo |
| 2019/0034784 A1 | 1/2019 | Li et al. |
| 2019/0042925 A1 | 2/2019 | Choe et al. |
| 2019/0050710 A1 | 2/2019 | Wang et al. |
| 2019/0057696 A1 | 2/2019 | Ogawa |
| 2019/0114142 A1 | 4/2019 | Yoda et al. |
| 2019/0122094 A1 | 4/2019 | Chen et al. |
| 2019/0122119 A1 | 4/2019 | Husain |
| 2019/0138372 A1 | 5/2019 | Tee |
| 2019/0164285 A1 | 5/2019 | Nye et al. |
| 2019/0180170 A1 | 6/2019 | Huang et al. |
| 2019/0199370 A1 | 6/2019 | Madduri et al. |
| 2019/0205737 A1 | 7/2019 | Bleiweiss et al. |
| 2019/0205746 A1 | 7/2019 | Nurvitadhi et al. |
| 2019/0220734 A1 | 7/2019 | Ferdman et al. |
| 2019/0228762 A1 | 7/2019 | Wang et al. |
| 2019/0251429 A1 | 8/2019 | Du et al. |
| 2019/0265949 A1 | 8/2019 | Ito |
| 2019/0278677 A1 | 9/2019 | Terechko et al. |
| 2019/0294968 A1 | 9/2019 | Vantrease et al. |
| 2019/0339937 A1 | 11/2019 | Lo et al. |
| 2020/0005424 A1 | 1/2020 | Appu et al. |
| 2020/0097799 A1 | 3/2020 | Divakar et al. |
| 2020/0117453 A1 | 4/2020 | Zhang et al. |
| 2020/0117614 A1 | 4/2020 | Zhang et al. |
| 2020/0125508 A1 | 4/2020 | Liu et al. |
| 2020/0126554 A1 | 4/2020 | Chen et al. |
| 2020/0126555 A1 | 4/2020 | Chen et al. |
| 2020/0142748 A1 | 5/2020 | Liu et al. |
| 2020/0159527 A1 | 5/2020 | Zhang et al. |
| 2020/0159530 A1 | 5/2020 | Zhang et al. |
| 2020/0159531 A1 | 5/2020 | Zhang et al. |
| 2020/0159532 A1 | 5/2020 | Zhang et al. |
| 2020/0159533 A1 | 5/2020 | Zhang et al. |
| 2020/0159534 A1 | 5/2020 | Li et al. |
| 2020/0160162 A1 | 5/2020 | Zhang et al. |
| 2020/0160163 A1 | 5/2020 | Liu et al. |
| 2020/0160219 A1 | 5/2020 | Zhang et al. |
| 2020/0160220 A1 | 5/2020 | Zhang et al. |
| 2020/0160221 A1 | 5/2020 | Zhang et al. |
| 2020/0160222 A1 | 5/2020 | Zhang et al. |
| 2020/0168227 A1 | 5/2020 | Chen et al. |
| 2020/0174547 A1 | 6/2020 | Fang et al. |
| 2020/0183752 A1 | 6/2020 | Liu et al. |
| 2020/0241874 A1 | 7/2020 | Chen et al. |
| 2020/0257972 A1 | 8/2020 | Miniskar et al. |
| 2020/0334041 A1 | 10/2020 | Zhang et al. |
| 2020/0334522 A1 | 10/2020 | Zhang et al. |
| 2020/0334572 A1 | 10/2020 | Zhang et al. |
| 2020/0394522 A1 | 12/2020 | Liu et al. |
| 2020/0394523 A1 | 12/2020 | Liu et al. |
| 2021/0042889 A1 | 2/2021 | Pei |
| 2021/0061028 A1 | 3/2021 | Da Deppo et al. |
| 2021/0117768 A1 | 4/2021 | Liu et al. |
| 2021/0117810 A1 | 4/2021 | Liu |
| 2021/0182177 A1 | 6/2021 | Su et al. |

(56) References Cited

U.S. PATENT DOCUMENTS

| | | |
|---|---|---|
| 2021/0264270 A1 | 8/2021 | Liu et al. |
| 2021/0286688 A1 | 9/2021 | Liu et al. |
| 2021/0334007 A1 | 10/2021 | Liu et al. |
| 2021/0334137 A1 | 10/2021 | Zhang et al. |
| 2021/0341989 A1 | 11/2021 | Chen et al. |
| 2021/0374510 A1 | 12/2021 | Liu et al. |
| 2021/0374511 A1 | 12/2021 | Liu et al. |

FOREIGN PATENT DOCUMENTS

| | | |
|---|---|---|
| CN | 1851668 A | 10/2006 |
| CN | 101572829 A | 11/2009 |
| CN | 102270042 A | 12/2011 |
| CN | 102404673 A | 4/2012 |
| CN | 102684701 A | 9/2012 |
| CN | 102761509 A | 10/2012 |
| CN | 102789413 A | 11/2012 |
| CN | 102903089 A | 1/2013 |
| CN | 102981854 A | 3/2013 |
| CN | 103152673 A | 6/2013 |
| CN | 104914977 A | 9/2015 |
| CN | 105389158 A | 3/2016 |
| CN | 103534664 A | 8/2016 |
| CN | 105893419 A | 8/2016 |
| CN | 105978611 A | 9/2016 |
| CN | 106156310 A | 11/2016 |
| CN | 106354568 A | 1/2017 |
| CN | 106406812 A | 2/2017 |
| CN | 106469291 A | 3/2017 |
| CN | 106485316 A | 3/2017 |
| CN | 106570559 A | 4/2017 |
| CN | 106650922 A | 5/2017 |
| CN | 106814639 A | 6/2017 |
| CN | 106951587 A | 7/2017 |
| CN | 106951962 A | 7/2017 |
| CN | 106997236 A | 8/2017 |
| CN | 107003988 A | 8/2017 |
| CN | 107025629 A | 8/2017 |
| CN | 107368174 A | 11/2017 |
| CN | 107451654 A | 12/2017 |
| CN | 107451658 A | 12/2017 |
| CN | 107608715 A | 1/2018 |
| CN | 107644254 A | 1/2018 |
| CN | 107688855 A | 2/2018 |
| CN | 107797913 A | 3/2018 |
| CN | 108053028 A | 5/2018 |
| CN | 104899641 A | 7/2018 |
| CN | 108337000 A | 7/2018 |
| CN | 108510067 A | 9/2018 |
| CN | 108717570 A | 10/2018 |
| CN | 109062540 A | 12/2018 |
| CN | 109063820 A | 12/2018 |
| CN | 109146057 A | 1/2019 |
| CN | 109214509 A | 1/2019 |
| CN | 109389219 A | 2/2019 |
| CN | 109472353 A | 3/2019 |
| CN | 109800877 A | 5/2019 |
| CN | 109902745 | 6/2019 |
| CN | 109934331 A | 6/2019 |
| CN | 109993296 A | 7/2019 |
| CN | 110059733 A | 7/2019 |
| CN | 11055450 A | 12/2019 |
| CN | 110780845 A | 2/2020 |
| EP | 0 789 296 A1 | 8/1997 |
| EP | 2 703 945 A2 | 3/2014 |
| EP | 3 106 997 A2 | 12/2016 |
| EP | 3 407 268 A1 | 11/2018 |
| IN | 106502626 A | 3/2017 |
| JP | 103-075860 A | 8/1989 |
| JP | H09-265379 A | 10/1997 |
| JP | 2009-134433 A | 8/2012 |
| JP | 2013-514570 A | 4/2013 |
| JP | 2014-199464 A | 10/2014 |
| JP | 2015-176158 A | 10/2015 |
| JP | 2018-26114 A | 2/2018 |
| JP | 2019-519852 A | 7/2019 |
| WO | 2008/153194 A1 | 12/2008 |
| WO | 2016/186823 A1 | 11/2016 |
| WO | 2017/138220 A1 | 8/2017 |
| WO | 2017/185412 A1 | 11/2017 |

OTHER PUBLICATIONS

Chen et al., "A Small-Footprint Accelerator for Large-Scale Neural Networks," ACM Transactions on Computer Systems (TOCS), vol. 33, Issue 2, May 1, 2015, Article No. 6, ACM, pp. 1-27, New York, NY, USA; available: https://dl.acm. Org/citation.cfm?id=2701417.

Chen, Y., et al., "DaDianNao: A Machine-Learning Supercomputer," MICRO-47 Proceedings of the 47th Annual IEEE ACM International Symposium on Microarchitecture, pp. 609-622, Cambridge, United Kingdom—Dec. 13, 2014; available: https://dl.acm.org/citation.cfm?id=2742217.

Luo, T., et al., "DaDianNao: A Neural Network Supercomputer," Published in: IEEE Transactions on Computers, vol. 66, Issue: 1, pp. 73-88, Date of Publication: May 30, 2016; available: https://ieeexplore.ieee.org/document/7480791.

Liu, D., et al., "PuDianNao: A Polyvalent Machine Learning Accelerator," ASPLOS '15 Proceedings of the Twentieth International Conference on Architectural Support for Programming Languages and Operating Systems, pp. 369-381, Istanbul, Turkey—Mar. 14, 2015; available: https://dl.acm.org/citation.cfm?id=2694358.

Du, Z., et al., "ShiDianNao: Shifting Vision Processing Closer to the Sensor," ISCA '15 Proceedings of the 42nd Annual International Symposium on Computer Architecture, pp. 92-104, Portland, Oregon—Jun. 13, 2015; available: https://dl.acm.org/citation.cfm?id=2750389.

Du, Z., et al., "An Accelerator for High Efficient Vision Processing," Published in: IEEE Transactions on Computer-Aided Design of Integrated Circuits and Systems, vol. 36, Issue: 2, Jun. 22, 2016, pp. 227-240; available: https://ieeexplore.ieee.org/document/7497562.

Liu, S., et al., "Cambricon: An Instruction Set Architecture for Neural Networks," 2016 ACM/IEEE 43rd Annual International Symposium on Computer Architecture (ISCA), Seoul, South Korea, Jun. 18, 2016; pp. 393-405, available: https://ieeexplore.ieee.org/document/7551409.

Zhang, S. et al., "Cambricon-X: An Accelerator for Sparse Neural Networks," Published in: 2016 49th Annual IEEE/ACM International Symposium on Microarchitecture (MICRO), Taipei, Taiwan, Oct. 15, 2016; 12 pages, available: https://ieeexplore.ieee.org/document/7783723.

Chen, Y., et al., "DianNao Family: Energy-Efficient Hardware Accelerators for Machine Learning," Communications of the ACM, vol. 59 Issue 11, Oct. 28, 2016, pp. 105-112, ACM New York, NY, USA; available: https://dl.acm.org/citation.cfm?id=2996864.

Vivienne Sze et al., "Efficient Processing of Deep Neural Networks: A Tutorial and Survey", arxiv.org, Cornell University Library, 201 Olin Library Cornell University Ithaca, NY 14853, Mar. 27, 2017 (Mar. 27, 2017), pp. 1-32, XP080759895, DOI: 10.1109/JPROC.2017.2761740.

Liu Shaoli et al., "Cambricon: An Instruction Set Architecture for Neural Networks", 2013 21st International Conference on Program Comprehension (ICPC); [International Symposium on Computer Architecture.(ISCA)], IEEE, US, Jun. 18, 2016 (Jun. 18, 2016), pp. 393-405, XP032950675, ISSN: 1063-6897, DOI: 10.1109/ISCA.2016.42 ISBN: 978-0-7695-3174-8 [retrieved on Aug. 24, 2016].

IBM, "PowerPC Microprocessor Family: Vector/SIMD Multimedia Extension Technology Programming Environments Manual Programming Environments Manual", Aug. 22, 2005 (Aug. 22, 2005), pp. 170-171, XP055673033, Retrieved from the Internet: URL:http://math-atlas.sourceforge.net/devel/assembly/ vector_simd_pem. ppc. 2005AUG23.pdf [retrieved on Mar. 3, 2020].

Sumod Mohan, "Accuracy and Multi-Core Performance of Machine Learning Algorithms for Handwritten Character Recognition", Aug. 1, 2009 (Aug. 1, 2009), 60 pages, XP055673941, Retrieved from the Internet: URL:https://tigerprints.clemson.edu/cgi/viewcontent.cgi?article=1634&context=all theses retrieved on Mar. 5, 2020].

(56) References Cited

OTHER PUBLICATIONS

Anonymous, "Control unit—Wikipedia", May 8, 2017 (May 8, 2017), 9 pages, XP055673879, Retrieved from the Internet: URL: https://web.archive.org/web/20170508110348/https://en.wikipedia.org/wiki/Control unit [retrieved on Mar. 5, 2020].
European Patent Office, Extended European Search Report for European Application No. 19212749.6 dated Mar. 18, 2020, 6 pages.
European Patent Office, Extended European Search Report for European Application No. 19212750.4 dated Mar. 18, 2020, 5 pages.
European Patent Office, Extended European Search Report for European Application No. 19212751.2 dated Mar. 18, 2020, 7 pages.
European Patent Office, Extended European Search Report for European Application No. 19212752.0 dated Mar. 18, 2020, 6 pages.
European Patent Office, Extended European Search Report for European Application No. 19214004.4 dated Mar. 18, 2020, 5 pages.
European Patent Office, Extended European Search Report for European Application No. 19213389.0 dated Mar. 18, 2020, 5 pages.
European Patent Office, Extended European Search Report for European Application No. 19212753.8 dated Mar. 18, 2020, 7 pages.
European Patent Office, Extended European Search Report for European Application No. 19212754.6 dated Mar. 18, 2020, 6 pages.
European Patent Office, Extended European Search Report for European Application No. 19212755.3 dated Mar. 18, 2020, 6 pages.
Joel Emer et al., "DNN Accelerator Architectures", CICS/MTL Tutorial, Jan. 1, 2017 (Jan. 1, 2017), XP055672691, 74 pages. Retrieved from the Internet: URL:https://www.rle.mit.edu/eems/wp-content/uploads/2017/031Tutorial-on-JNN-4-of-5-DNN-Accelerator-Architectures.pdf [retrieved on Mar. 2, 2020].
Chen Yu-Hsin et al., "Eyeriss: An Energy-Efficient Reconfigurable Accelerator for Deep Convolutional Neural getworks", IEEE Journal of Solid-State Circuits, IEEE, USA, vol. 52, No. 1, Jan. 1, 2017 (Jan. 1, 2017), pp. 127-138, XP011638633, ISSN: 0018-9200, DOI: 10.1109/JSSC.2016.2616357 [retrieved on Jan. 9, 2017].
European Patent Office, Extended European Search Report for European Application No. 19212756.1 dated Mar. 18, 2020, 7 pages.
European Patent Office, Extended European Search Report for European Application No. 18906652.6 dated Mar. 18, 2020, 5 pages.
European Patent Office, Extended European Search Report for European Application No. 19212746.2 dated Mar. 18, 2020, 8 pages.
Kalathingal Sajith et al., "Dynamic Inter-Thread Vectorization Architecture: Extracting OLP from TLP", 2016 28th International Symposium on Computer Architecture and High Performance Computing (SBAC-PAD), IEEE, Oct. 26, 2016, pp. 18-25, XP033028005, DOI: 10.1109/SBAC-PAD.2016.11.
Li et al., "Using Artificial Neural Network for Predicting Thread Partitioning in Speculative Multithreading", IEEE, 2015, pp. 823-826.
Na et al., "Speeding up Convolutional Neural Network Training with Dynamic Precision Scaling and Flexible MultiplierAccumulator", Section 2 Proposed Approach: Concept, ACM, Aug. 8-10, 2016, 6 pages.
Hanlon, Jamie, "Why is so much memory needed for deep neural networks?", URL: https://www.graphcore.ai/posts/why-is-so-much-memory-needed-for-deep-neural-networks, Jan. 31, 2017, 6 pages.
Pedro O. Domingos, et al., "An Efficient and Scalable Architecture for Neural Networks With Backpropagation Learning" Proceedings/ 2005 International Conference on Field Programmable Logic and Applications {Fpl): Tampere Hall, Tampere, Finland, Jan. 1, 2005, pp. 89-94, XP055606447, Piscataway, NJ. DOI: 10.1109/FPL.2005. 1515704 ISBN: 978-0-7803-9362-2.
Extended European Search Report for Application No. 19215861.6 mailed May 15, 2020, 17 pages.
Extended European Search Report for Application No. 19215862.4 mailed May 15, 2020, 17 pages.
Sumina Yamashita, et al., "A Method to create illustrate images using DCGAN," JISJ SIG Technical Report, vol. 2017-MPS-112 No. 16, Feb. 27, 2017, 8 pages. (Translation of Abstract Included).
European Patent Office, Extended European Search Report for European Application No. 19218382.0 dated Apr. 24, 2020, 11 pages.
Yi Yang et al., "Deploy Large-Scale Deep Neural Networks in Resource Constrained Io T Devices with Local Quantization Region", arxiv.org, Cornell University Library, 201 Olin Library Cornell University Ithaca, NY 14853, May 24, 2018 (May 24, 2018), 8 pages, XP081234517.
Gysel Philipp et al., "Ristretto: A Framework for Empirical Study of Resource-Efficient Inference in Convolutional Neural Networks", IEEE Transactions on Neural Networks and Learning Systems, IEEE, Piscataway, NJ, USA, vol. 29, No. 11, Nov. 1, 2018 (Nov. 1, 2018), pp. 5784-5789, XP011692881, ISSN: 2162-237X, DOI: 10.1109/TNNLS.2018.2808319 [retrieved on Oct. 17, 2018].
Hsu Jeremy, "For sale: deep learning [News]", IEEE Spectrum, IEEE Inc. New York, US, vol. 53, No. 8, Aug. 1, 2016 (Aug. 1, 2016), pp. 12-13, XP011620787, ISSN: 0018-9235, DOI: 10.1109/MSPEC.2016.7524158 [retrieved on Jul. 27, 2016].
Song Mingcong et al., "In-Situ AI: Towards Autonomous and Incremental Deep Learning for IoT Systems", 2018 IEEE International Symposium on High Performance Computer Architecture (HPCA), IEEE, Feb. 24, 2018 (Feb. 24, 2018), pp. 92-103, XP033341941, DOI: 10.1109/HPCA.2018.00018 [retrieved on Mar. 27, 2018].
Kallam Suresh et al., "Evaluating the Performance of Deep Learning Techniques on Classification Using Tensor Flow Application", 2018 International Conference on Advances in Computing and Communication Engineering (ICACCE). IEEE, Jun. 22, 2018 (Jun. 22, 2018), pp. 331-335, XP033389370, DOI: 10.1109/CACCE.2018. 844167 4 [retrieved on Aug. 20, 2018].
Olariu Cristian et al., "A Cloud-Based AI Framework for Machine Learning Orchestration: A "Driving or Not-Driving" Case-Study for Self-Driving Cars", 2019 IEEE Intelligent Vehicles Symposium (IV). IEEE, Jun. 9, 2019 (Jun. 9, 2019), pp. 1715-1722, XP033606002, DOI: 10.1109/IVS.2019.8813870 [retrieved on Aug. 26, 2019].
European Patent Office, extended European search report for Application No. 19216754.2 mailed May 8, 2020, 8 pages.
Extended European Search Report for EP Application No. 19214324.6 mailed Oct. 1, 2020, 11 pages.
International Searching Authority, International Search Report for PCT Application No. PCT/ CN2019/093144 mailed Oct. 9, 2019, 6 pages.
Communication pursuant to Article 94(3) EPC received for European Application No. 18861574.4, dated Jun. 2, 2022, 20 pages.
Anonym et al.; Trellis Quantization; Wikipedia, Dated Jun. 25, 2016; 1 Page.
Banner et al.; Post training 4-bit quantization of convolutional networks for rapid-deployment; Dated May 29, 2019; pp. 1-16.
Krishnamoorthi, Quantizing deep convolutional networks for efficient inference—A whitepaper, arxiv.org, Cornell University Library, 201 Olin Library Cornell University Ithaca, NY, Dated Jun. 21, 2018; pp. 36.
Kullback et al. On information and sufficiency, The Annals of mathematical statistics, Institute of Mathematical Statistics, Baltimore, MD, vol. 22; Dated Jan. 1, 1951; pp. 9.
Zhao Ritchie et al: "Improving Neural Network Quantization without Retraining using Outlier Channel Splitting", arXiv:1901. 09504v3, May 22, 2019 (May 22, 2019), pp. 1-10, XP093073204, DOI: 10.48550/arxiv.1901.09504 Retrieved from the Internet: URL:https://arxiv.org/pdf/1901.09504.pdf [retrieved on Aug. 11, 2023].

* cited by examiner

DATA PROCESSING METHOD AND APPARATUS, AND RELATED PRODUCT

CROSS-REFERENCE TO RELATED APPLICATIONS

This application is a continuation of PCT/CN2020/111495 filed Aug. 26, 2020, which claims priority to Chinese Patent Application No. 201910792847.0 filed on Aug. 26, 2019. The disclosures of the aforementioned applications are hereby incorporated by reference in their entireties.

TECHNICAL FIELD

The present disclosure relates to the field of computer technology, and specially to a method, a device, and related products for processing data.

BACKGROUND

With the development of computer technology, deep learning algorithms are more and more used to handle various complex tasks. Using deep learning algorithms to process data has achieved good results in searching technology, data mining, machine learning, machine translation, natural language processing, multimedia learning, speech, recommendation and personalization technology and other related fields.

With the increasing number of network layers and increasing computational complexity, improving the computing ability of devices is very important for the development of deep learning. Therefore, people use various methods to improve the computing ability of the device. However, there are still many problems that need to be solved in improving computing ability in the process of machine learning.

SUMMARY

In view of this, the present disclosure provides a method, a device, and related products for processing data.

According to the first aspect of the present disclosure, a method for processing data is provided. The method includes obtaining a plurality of pieces of data for machine learning model, where the data is represented in a first data format. The method further includes distributing the plurality of pieces of data in the first group of intervals based on the values of the plurality of pieces of data, where the number of the first group of intervals is predetermined. The method also includes determining a first average value of the plurality of pieces of data. The method further includes mapping the data distributed in the first group of intervals to a second group of intervals according to a plurality of different mapping units to determine a second average value of the mapped data according to a corresponding mapping unit. The mapping unit includes a predetermined number of consecutive intervals starting from the first interval of the first group of intervals, and an end interval of the mapping unit is distributed with data that is greater than or located in the end interval among the plurality of pieces of data. The number of intervals in the second group of intervals is related to a second data format, and the precision of the second data format is lower than that of the first data format. The method further includes processing the plurality of pieces of data based on the first average value and a plurality of second average values, so that the processed plurality of pieces of data is represented in the second data format.

According to the second aspect of the present disclosure, a device for processing data is provided. The device includes an acquisition unit, a distribution unit, a first average value determining unit, a first mapping unit, and an execution unit. The acquisition unit is configured to acquire a plurality of pieces of data for a machine learning model, and the data is represented in the first data format. The distribution unit is configured to distribute the plurality of pieces of data in the first group of intervals based on values of the plurality of pieces of data, where the number of the first group of intervals is predetermined. The first average value determining unit is configured to determine the first average value of the plurality of pieces of data. The first mapping unit is configured to map the data distributed in the first group of intervals to the second group of intervals according to a plurality of different mapping units to determine a second average value of the mapped data according to the corresponding mapping unit. The mapping unit includes a predetermined number of consecutive intervals starting from the first interval of the first group of intervals, and the end interval of the mapping unit is distributed with data larger than or located in the end interval of the plurality of pieces of data. The number of intervals in the second group of intervals is related to the second data format, and the accuracy of the second data format is lower than that of the first data format. The execution unit is configured to process the plurality of pieces of data based on the first average value and the plurality of second average values, so that the processed plurality of pieces of data is represented in the second data format.

According to the third aspect of the present disclosure, an artificial intelligence chip is provided. The artificial intelligence chip includes a processor and a memory, where the memory stores computer program instructions, and the processor runs the computer program instructions in the memory to control the artificial intelligence chip to execute the method according to the first aspect.

According to the fourth aspect of the present disclosure, an electronic device is provided. The electronic device is the artificial intelligence chip according to the third aspect of the present disclosure.

According to the fifth aspect of the present disclosure, a board card is provided. The board card includes: a storage device, an interface device, a control device, and the artificial intelligence chip according to the third aspect of the present disclosure. The artificial intelligence chip is respectively connected with the storage device, the control device, and the interface device. The storage device is used to store data; the interface device is used to realize data transmission between the artificial intelligence chip and an external device; and the control device is used to monitor the state of the artificial intelligence chip.

Through the derivation of the technical features in the claims, the technical effect of the technical problems in the background may be achieved. According to the following detailed description of exemplary embodiments with reference to the drawings, other features and aspects of the present disclosure will become clear.

BRIEF DESCRIPTION OF THE DRAWINGS

The drawings are included in the specification and constitute a part of the specification. Together with the specification, the drawings illustrate exemplary embodiments, features, and aspects of the present disclosure, and are used to explain principles of the present disclosure. In the exem

In the drawings, the same or corresponding reference numerals indicate the same or corresponding parts.

DETAILED DESCRIPTION OF THE EXAMPLES

Figure 1:
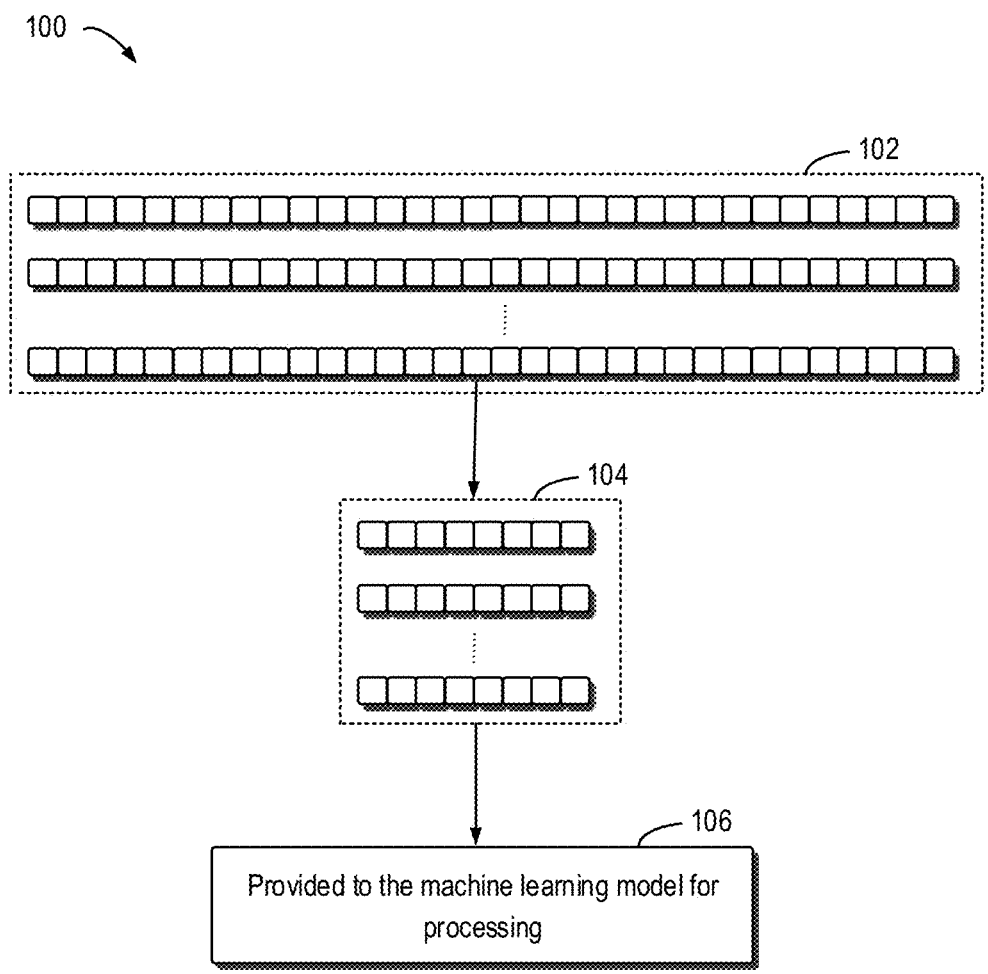
- FIG. 1 illustrates a schematic diagram of an example environment 100 in which a device and/or a method according to an embodiment of the present disclosure may be implemented.

Technical solutions in embodiments of the present disclosure will be described clearly and completely hereinafter with reference to the drawings in the embodiments of the present disclosure. Obviously, the embodiments to be described are merely some rather than all examples of the present disclosure. All other embodiments obtained by those of ordinary skill in the art based on the embodiments of the present disclosure without creative efforts shall fall within the protection scope of the present disclosure.

It should be understood that the terms such as "first", "second", "third", and "fourth" appear in the claims, the specification, and drawings are used for distinguishing different objects rather than describing a specific order. It should be understood that the terms "including" and "comprising" used in the specification and the claim indicate the presence of a feature, an entity, a step, an operation, an element, and/or a component, but do not exclude the existence or addition of one or more other features, entities, steps, operations, elements, components, and/or collections thereof.

It should also be understood that terms used in the specification of the present disclosure are merely for the purpose of describing particular embodiments rather than limiting the present disclosure. As being used in the specification and the claim of the disclosure, unless the context clearly indicates otherwise, the singular forms "a", "an", and "the" are intended to include the plural forms. It should also be understood that the term "and/or" used in the specification and the claim refers to any and all possible combinations of one or more of relevant listed items and includes these combinations.

As being used in this specification and the claim, the term "if" can be interpreted as "when", or "once" or "in response to a determination" or "in response to a case where something is detected" depending on the context. Similarly, depending on the context, the clause "if it is determined that" or "if [a described condition or event] is detected" can be interpreted as "once it is determined that", or "in response to a determination", or "once [a described condition or event] is detected", or "in response to a case where [a described condition or event] is detected".

With the development of neural network algorithms, there are more and more network layers in the neural network. This development trend leads to higher computational complexity. In addition, this development trend of neural networks requires a greater development in the computing power of computing devices. In some cases, due to the limitation of computing resources, the limited computing resources cannot be well used to process neural network algorithms.

Generally, the data processed in the computing device is 32-bit floating-point data. When a large amount of such floating-point data is to be processed, the computing device is required to provide strong computing power and large storage space to store these data. In addition, the large amount of data transmitted during the transmission process will also affect the processing efficiency of the machine learning model.

In order to solve at least one existing problem, the present disclosure proposes a method for processing data. The processing data related to the neural network is distributed into predetermined number of intervals, and then the optimal truncation threshold is selected based on the average value of the data. The truncation data threshold is used to truncate the data, and the data is quantized from the high-precision format to the low-precision format. For example, the 32-bit floating-point data is converted to 8-bit integer data. The method in the present disclosure can ensure the precision of data processing as high as possible while reducing the amount of data processing. In addition, the method also helps to significantly reduce the amount of data transmission, thereby greatly accelerating the data exchange among a plurality of computing devices.

FIG. 1 illustrates a schematic diagram of an example environment 100 in which a device and/or a method according to embodiments of the present disclosure may be implemented.

The example environment 100 includes a plurality of pieces of data 102 related to a machine learning model. Each of the plurality of pieces of data 102 has the same high-precision format. The precision format of the data 102 is only relative to the precision of the plurality of pieces of data 104 after conversion. FIG. 1 shows that the plurality of pieces of data 102 are, for example, 32-bit floating-point data. The number of data bits of the plurality of pieces of data 102 in FIG. 1 is 32 bits, which is only for example, and is not a limitation of the disclosure. The data 102 may be data in any suitable relatively high-precision format, such as 64-bit double-precision data or data of any suitable precision set as required.

In some embodiments, the machine learning model is a neural network model. Neural network model includes, but is not limited to, convolutional neural network model, recurrent neural network model and so on.

In some embodiments, the plurality of pieces of data 102 related to the machine learning model may be weight values, input neuron data, output neuron data, and/or offset values of the machine learning model. The above examples are only used to describe the present disclosure, but not to specifically limit the present disclosure. The plurality of pieces of data 102 related to the machine learning model may be any related data used or to be processed in the machine learning model.

A plurality of pieces of data 102 related to the machine learning model is processed by a computing device to be converted into a plurality of pieces of data 104 in a low-precision format. As shown in FIG. 1, a plurality of pieces of data 102 is converted from floating-point data in a 32-bit high-precision format to a plurality of 8-bit integer data 104 in a low-precision format. Each of the plurality of pieces of data 104 is represented by 8 bits. Therefore, a plurality of pieces of data 104 can represent the range from −128 to 127. It should be understood that the low-precision format of the plurality of pieces of data 104 is only related to the precision format of the data 102 before conversion. The use of 8 data bits for each of the plurality of pieces of data 104 shown in FIG. 1 is only an example, but is not a specific limitation to the present disclosure. Therefore, the precision format of the plurality of pieces of data 104 may be any suitable data type lower than the precision format of the plurality of pieces of data 102.

Computing devices used to convert data in high-precision formats into low-precision formats include, but are not limited to, personal computers, server computers, handheld or laptop devices, mobile devices (such as mobile phones, personal digital assistants (PDAs), and media players and so on.), multi-processor systems, consumer electronic products, small computers, large computers, distributed computing environments including any of the above systems or devices, etc.

In the process of converting the plurality of pieces of data 102 into the plurality of pieces of data 104 by the computing device, First the maximum value of the absolute value of the data in the plurality of pieces of data 102 is determined. Then the entire range from 0 to the maximum is divided into a predetermined number N of a group of intervals. The plurality of pieces of data 102 is distributed into the group of intervals according to their absolute values. The predetermined number N can be any suitable value. In some embodiments, the predetermined number N is greater than the maximum value of the data in the low-precision format. For example, when 8 bits are used to represent an integer, the maximum value represented by 8 bits is 127. Therefore, the predetermined number N may be a value greater than 127, such as 256, 528, 1024, or 2048.

The computing device determines the first average value of the plurality of pieces of data before the interval conversion. The computing device also forms a mapping unit for the first j intervals in the group of intervals, where j is a positive integer greater than 0, and j starts with a value M that smaller than N and changes to N, then N−M+1 mapping units can be formed. In some embodiments, M=the maximum value represented by the data in the low-precision format+1. In the example of the aforementioned data 102, for example, M=127+1=128.

The computing device may respectively map the N−M+1 mapping units to the second group of intervals of the second number that are divided based on the number of bits of the data in the low-precision format to determine the second average value of the mapped data according to corresponding mapping units. For each mapping unit, the computing device can obtain the second average value of the data mapped to the second group of intervals. For each mapping unit, the computing device can determine the difference between the first average value and the second average value. In an example, the mapping unit with the smallest difference value is determined. In other words, the value of j is determined. According to the value of j, the truncation threshold can be determined. Then the data is truncated. In other words, the data that is greater than the truncation threshold among the plurality of pieces of data is modified to the truncation threshold. Then a scale value is determined using the truncation value. For the plurality of pieces of data that has been truncated, the scale value is used to perform scaling processing to convert the data into a plurality of pieces of data 104 that has the second data format.

After converting the plurality of pieces of data 102 into the plurality of pieces of data 104, the plurality of pieces of data 104 may be provided to the machine learning model for processing 106.

Figure 2:
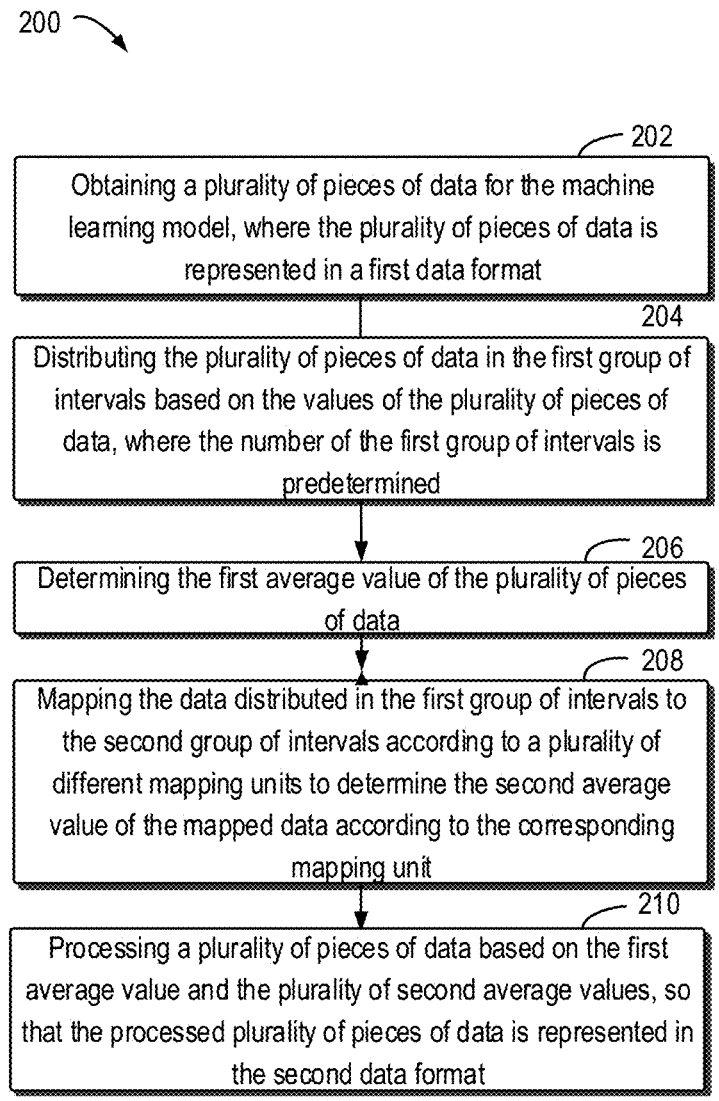
FIG. 2 illustrates a flowchart of a process 200 for processing data according to an embodiment of the present disclosure.

FIG. 1 illustrates a schematic diagram of an example environment 100 in which a device and/or a method according to an embodiment of the present disclosure may be implemented. The following describes a process 200 for processing data according to an embodiment of the present disclosure with reference to FIG. 2. FIG. 2 illustrates a flowchart of the process 200 for processing data according to an embodiment of the present disclosure.

As shown in FIG. 2, at block 202, the computing device obtains a plurality of pieces of data for the machine learning model, and the plurality of pieces of data is represented in a first data format. As shown in FIG. 1, a plurality of pieces of data 102 obtained by the computing device, each of the plurality of pieces of data 102 is in a 32-bit floating-point format. The 32-bit floating-point format of each of the plurality of pieces of data 102 in FIG. 1 is only for example, and is not a specific limitation to the present disclosure.

In some embodiments, the plurality of pieces of data used for the machine learning model are weight values, input neuron data, output neuron data, and/or offset values in the machine learning model. The above examples are only used to describe the present disclosure, but not to specifically limit the present disclosure. The plurality of pieces of data used for the machine learning model can be any related data used in the machine learning model.

At block 204, the computing device distributes the plurality of pieces of data in the first group of intervals based on the values of the plurality of pieces of data, and the number of the first group of intervals is predetermined. In order to quantize data, the data is generally distributed into a predetermined number of intervals determined in advance. In some embodiments, the number N of data intervals can be set to any suitable number, for example, 256, 1024, or 2048. Alternatively or additionally, the number N of data intervals may be selected to be greater than the largest integer represented by the converted data type. For example, when the data to be converted is an 8-bit integer, the largest integer represented by the 8-bit integer is 127. Therefore, a number greater than 127 can be selected as the interval number. For example, the number N of data intervals can be 256, 512, 1024, or 2048.

After determining the number N of intervals to be divided, the data with the largest absolute value among the plurality of pieces of data is determined, and the entire data interval between 0 and the maximum absolute value is divided into a first group of intervals including N intervals.

At block 206, the computing device determines the first average value of the plurality of pieces of data. For the accuracy of the constant conversion, the present disclosure uses the difference between the average value of the data before the conversion and the average value of the data after the conversion to determine the accuracy of the constant conversion. Therefore, it is necessary to calculate the average value of plurality of pieces of data before conversion.

In some embodiments, when the computing device calculates the average value of the received plurality of pieces of data, the computing device first determines the absolute value of the plurality of pieces of data and the number of the plurality of pieces of data. Then, the computing device determines the average value based on the absolute value and the amount of data in the plurality of pieces of data. For example, the absolute values of all data are added, and then divided by the number of absolute values to determine the first average value of the data to be processed.

In some embodiments, when the computing device calculates the first average value of the received plurality of pieces of data, the computing device determines the intermediate value of each interval in the first group of intervals and the number of data that each interval has. In order to facilitate the calculation, the intermediate value of each interval is used as the average value of the data in the interval. Then, the computing device determines the average value based on the intermediate value of each interval and the amount of data in the interval. More specifically, the computing device multiplies the intermediate value of each interval by the amount of data in each interval, then adds them together, and then divides them by the total number of data to determine the first average value of the data.

In some embodiments, when determining the first average value of the plurality of pieces of data, the first average value is associated with the corresponding mapping unit. The computing device first determines the amount of data in each interval of the mapping unit and the intermediate value of each interval, where one of the mapping units corresponds to the first j intervals from the first interval in the first group of intervals, and takes the last interval of the j intervals as the end interval. Then the data in the interval behind the end interval in the first group of intervals is put in the end interval. In other words, the amount of data in the end interval of the mapping unit at this time is the sum of the amount of data in the interval corresponding to the ending interval in the first group of intervals and the amount of data in all the intervals after the interval. Then, the computing device determines the first average value based on the amount of data in each interval and the intermediate value of each interval.

At block 208, the computing device maps the data distributed in the first group of intervals to the second group of intervals according to a plurality of different mapping units to determine the second average value of the mapped data according to the corresponding mapping unit. The mapping unit includes a predetermined number of consecutive intervals starting from the first interval of the first group of intervals, and the end interval of the mapping unit is distributed with data larger than or located in the end interval among a plurality of pieces of data. The number of intervals in the second group of intervals is related to the second data format, and the accuracy of the second data format is lower than that of the first data format.

After a plurality of pieces of data is divided into the first group of intervals, the first j intervals from the first group of intervals is selected as the mapping unit, and the value of j ranges from a value M that is less than N to the total number of N in the first group of intervals. Therefore, there are N−M+1 mapping units. In some embodiments, the value of M is greater than the maximum value represented by the data in the low-precision format. In an example, when the data in the low-precision format is 8 bits, the maximum value it represents is 127, and M takes 128.

The computing device then respectively maps the N−M+1 mapping units to the second group of intervals of the second number that can be represented by the data in the low-precision format. In an example, if the format of the plurality of pieces of data 104 in FIG. 1 is an 8-bit integer, the interval in each mapping unit may be mapped to 128 intervals in the second group of intervals. Therefore, the j/128 intervals in the mapping unit are mapped to one interval in the second group of intervals.

Then, for each mapping unit, the computing device can obtain the second average value of the data mapped to the second interval. After mapping to the second interval, for each mapping unit, the average value after the mapping is determined by the intermediate value of intervals in the second group of intervals and the number of intervals located in the interval. For example, the intermediate value of each interval in the second interval is multiplied by the amount of data in each interval, and then divided by the total number of data to obtain the second average value.

At block 210, the computing device processes a plurality of pieces of data based on the first average value and the plurality of second average values, so that the processed plurality of pieces of data is represented in the second data format. The processing of plurality of pieces of data will be described in detail below with reference to FIG. 3.

Through the above method, data in a high-precision format can be converted into data in a low-precision format for processing. As the number of bits used to represent the data is reduced, the computing resources used to process the data can be reduced. At the same time, since the mapping unit with the smallest difference from the average value of the data before conversion is selected from a plurality of mapping units, the accuracy of processing results can be retained as much as possible.

Figure 3:
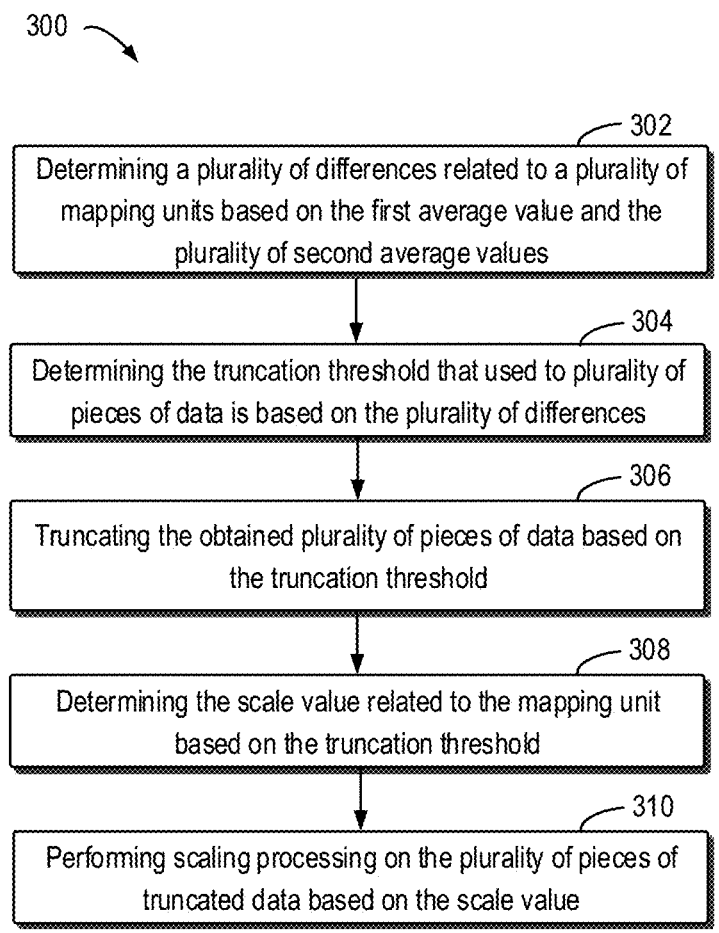
FIG. 3 illustrates a flowchart of a process 300 for processing data according to an embodiment of the present disclosure.

FIG. 2 above describes a flowchart of a process 200 for processing data according to an embodiment of the present disclosure. The process for processing data at block 210 in FIG. 2 is described below with reference to FIG. 3, where FIG. 3 illustrates a flowchart of a process 300 for processing data according to an embodiment of the present disclosure.

At block 302, the computing device determines a plurality of differences related to a plurality of mapping units based on the first average value and the plurality of second average values. After obtaining the first average value of the received plurality of pieces of data and the second average value corresponding to each mapping unit, the computing device will determine the difference between the first average value and each second average value. Therefore, the computing device can obtain a plurality of differences corresponding to a plurality of mappings.

In one example, the entire interval from 0 to the maximum absolute value of plurality of pieces of data is divided into 2048 intervals. When changing the plurality of pieces of data from the first precision format to an 8-bit integer, j changes from 128 to 2047 to select the first j+1 intervals from 2048 intervals as the mapping unit. As described above, the first average value mean1 of plurality of pieces of data can be obtained. Each j value corresponds to a mapping unit, and the data in the interval after the mapping unit is put into the last interval of the j+1 intervals of the mapping unit. Then the j+1 intervals are mapped to 128 second intervals, and then the intermediate value of each interval in the 128 second intervals and the number of data in each interval in the second interval are determined. Then the product of the intermediate value of each interval in j+1 intervals and the number of data in the interval are added together, and then divided by the total number of data to determine the second average value mean2. For each mapping unit, differences of the average value after interval truncation processing is mean1−mean2.

At block 304, the truncation threshold that used to plurality of pieces of data is determined based on the plurality of differences. The computing device determines the mapping unit corresponding to the smallest difference among the plurality of differences based on the plurality of differences. In an example, after obtaining a plurality of differences, the computing device separately divides each of the plurality of differences by their corresponding first average value to obtain a plurality of difference rates. The mapping unit with the smallest difference rate is used as the selected mapping unit. In one example, after obtaining a plurality of differences, the computing device may choose the mapping unit corresponding to the smallest differences among the plurality of differences as the selected mapping unit.

After determining the mapping unit based on a plurality of differences, the value of j is determined. Then the value of j can be used to determine the truncation threshold. In an example, the truncation threshold can be determined by the following formula (1):

$$\text{threshold} = (\text{best\_j} + 0.5) * \frac{1}{N} \text{absmax} \quad (1)$$

where best_j is the number of intervals of the mapping unit corresponding to the determined minimum difference or difference rate, N represents the number of intervals in the first group of divided intervals, and absmax represents the maximum absolute value of plurality of pieces of data.

At block 306, the computing device truncates the obtained plurality of pieces of data based on the truncation threshold. After obtaining the truncation threshold, the computing device regulates values that greater than the truncation threshold of the plurality of pieces of data to the truncation threshold.

At block 308, the computing device determines the scale value related to the mapping unit based on the truncation threshold. In an example, after selecting the mapping unit corresponding to the threshold difference, the computing device determines the truncation threshold for the plurality of pieces of received data based on the number of intervals corresponding to the mapping unit. Then, the truncation threshold is used to determine the scale value through the following formula (2).

$$\text{scale} = \text{threshold}/(2^{n-1}-1) \quad (2),$$

where n represents the number of bits of data in the second data format.

In an example, when the converted data is an 8-bit integer, scale=threshold/127. The above examples are only used to illustrate the present disclosure, but not to specifically limit the present disclosure.

Optionally, at block 310, the computing device performs scaling processing on the plurality of pieces of truncated data based on the scale value, and then obtains the plurality of pieces of data in the second data format. In some embodiments, the scaling processing of plurality of pieces of data can also be performed on other computing devices.

Through the above method, the optimal truncation threshold can be found when the data is converted from the first data format to the second data format, and the error between the data before and after the data format conversion can be minimized.

In an embodiment, a plurality of pieces of data represented in the first data format, for example, in a 32-bit floating-point number format, for the machine learning model is obtained. In order to reduce the amount of data, the plurality of pieces of data is converted into a second data format, such as 8-bit integer data. The maximum absolute value absmax is found from the plurality of pieces of data. Then the interval from 0 to the absolute maximum value is divided into 2048 intervals. Before the conversion, the plurality of pieces of data is distributed into 2048 data intervals according to the absolute value.

Then the number of plurality of pieces of data distributed in each interval of 2048 intervals is counted. For example, bin[i] represents the number of the plurality of pieces of data whose absolute values fall between i/2048 absmax~(i+1)/2048 absmax, which means the number that falls in the i+1th interval, where bin [0] represents the number of plurality of pieces of data whose absolute values fall within the first interval 0~1/2048 absmax.

At this time, the first average value of plurality of pieces of data can be determined. In an example, the first average value mean1 of the plurality of pieces of data is determined by adding the absolute values of the plurality of pieces of data and dividing by the number of the plurality of pieces of data. In an example, the first average value mean1 of plurality of pieces of data can be obtained by multiplying the intermediate value of each interval by the amount of data in each interval, then adding the products for all intervals, and dividing by the amount of data. In some examples, the first average value mean1 may be determined when determining each mapping unit.

Set j as the number of intervals corresponding to the mapping unit. In the case that the second data format is an 8-bit integer, j changes from 128 to 2047, and j takes each value from 128 to 2047, which corresponds to one mapping unit.

For each value of j, in bin_before [0]=bin [0], bin_before [1]=bin[1], . . . , bin_before[j−2]=bin[j−2], which are the previous j−1 intervals, the number of data remains unchanged. And Bin_before[j−1]=$\Sigma_{j-1}^{2047}$bin[k], which means the number of data distributed in the j intervals, is the sum of the number of data originally distributed in the interval j and after the interval j.

At this time, after the data interval is truncated, the average value of the data after the interval truncation may be used as the first average value. After interval truncation, for each interval, the intermediate value is multiplied by the amount of data in the interval, and then the products of each interval are added, and then divide by the total number of data to determine the first average value mean1 for each mapping unit.

For each value of j corresponding to each mapping unit, bin_before[0], bin_before[1], . . . , bin_before[j−1] are compressed to bin_next[0], bin_next[1], . . . , bin_next[127]. In other words, the j/128th bin_before is correspond to one bin_next. Then the average value of a plurality of intervals after adjustment is calculated. In other words, the intermediate value of each interval is multiplied by the amount of data in each interval, and the sum of the products of all intervals is divided by the total number of data, to obtain the average value mean2 of the second group of intervals corresponding to the mapping unit. The difference mean1−mean2 between the first average value and the second average value can then be determined.

The difference rate between the first average value mean1 and the second average value mean2 is calculated through the following formula (3):

$$\text{diff\_mean} = \text{abs}(\text{mean1} - \text{mean2})/\text{mean1} \quad (3),$$

where abs(mean1−mean2) represents the absolute value of (mean1−mean2).

J is changed from 128 to 2047, each j value has a corresponding diff_mean, and the j value corresponding to the smallest diff_mean from all j values is selected. After determining the value of j, the truncation threshold can be determined through the above formula (1). Then the plurality of pieces of data is truncated. After the truncation processing, the plurality of pieces of data can be quantized through the above formula (2).

It should be noted that above mentioned embodiments, for the sake of conciseness, are all described as a series of action combinations, but those skilled in the art should know that the present disclosure is not limited by the described order of action since some steps may be performed in a different order or simultaneously according to the present disclosure. Secondly, those skilled in the art should also understand that the embodiments described in the specification are all optional, and the actions and units involved are not necessarily required for this disclosure.

It should be further noted that although the steps in the flowchart are displayed in sequence as indicated by the arrows, these steps are not necessarily executed in the order indicated by the arrows. Unless there is a clear description in this article, there is no strict order for the execution of these steps, and these steps can be executed in other orders. Moreover, at least part of the steps in the flowchart may include a plurality of sub-steps or a plurality of stages, which are not necessarily executed at the same time, but can be executed at different times. The execution of these sub-steps or stages is not necessarily performed sequentially, but may be performed alternately with other steps or sub-steps of other steps or at least a part of the stages.

Figure 4:
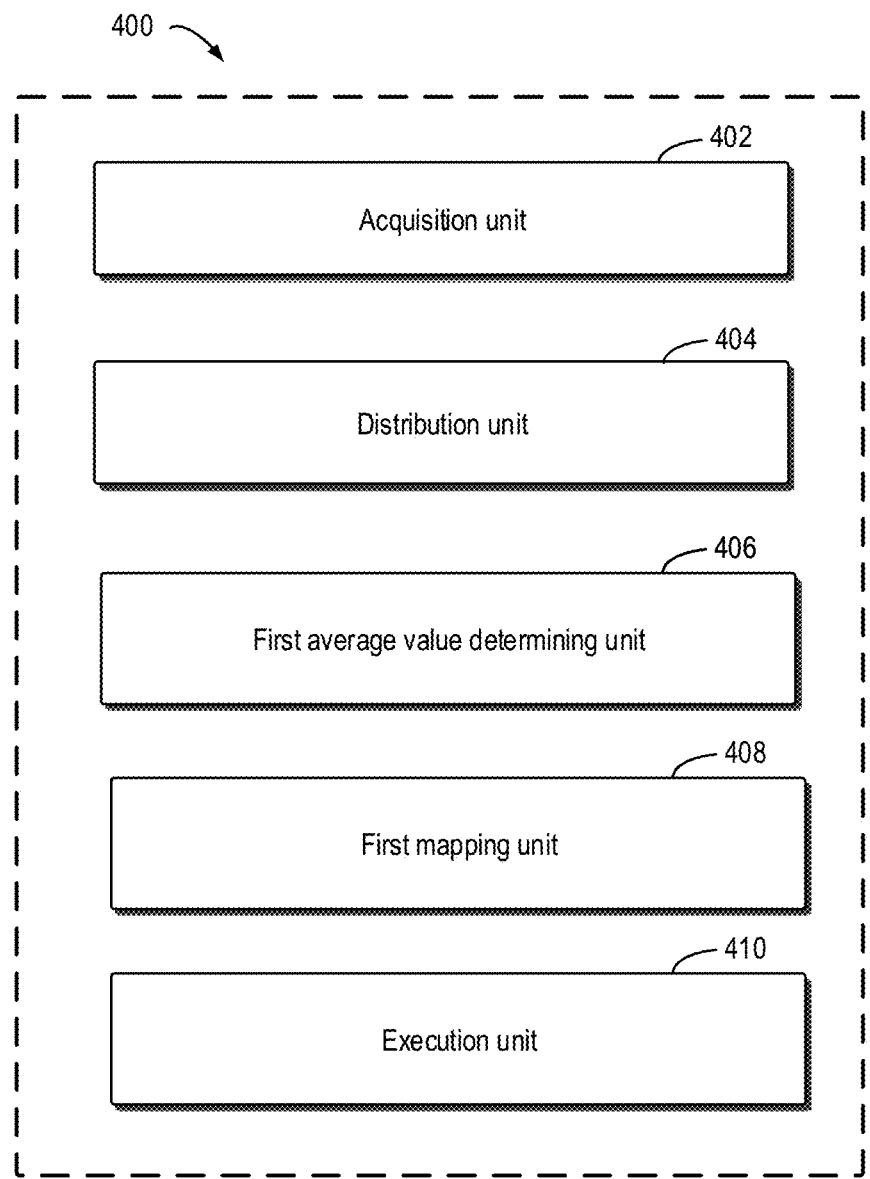
FIG. 4 illustrates a structural diagram of a device 400 for processing data according to an embodiment of the present disclosure.

FIG. 4 shows a device 400 for processing data, including an acquisition unit 402, a distribution unit 404, a first average value determining unit 406, a first mapping unit 408, and an execution unit 410. The acquisition unit 402 is configured to acquire a plurality of pieces of data for the machine learning model, where the data is represented in a first data format. The distribution unit 404 is configured to distribute the plurality of pieces of data to the first group of intervals based on the values of the plurality of pieces of data, and the number of the first group of intervals is predetermined. The first average value determining unit 406 is configured to determine the first average value of the data. The first mapping unit 408 is configured to map the data distributed in the first group of intervals to the second group of intervals according to a plurality of different mapping units to determine the second average value of the mapped data according to the corresponding mapping unit. The mapping unit includes a predetermined number of consecutive intervals starting from the first interval of the first group of intervals, and the ending interval of the mapping unit is distributed with the plurality of pieces of data that is larger than or located in the end interval. The number of intervals in the second group of intervals is related to the second data format, and the accuracy of the second data format is lower than that of the first data format. The execution unit 410 is configured to process the plurality of pieces of data based on the first average value and the plurality of second average values, so that the plurality of processed data is expressed in the second data format.

In some embodiments, the first mapping unit 408 includes a redistribution unit and a second mapping unit. The redistribution unit is configured to redistribute data in the plurality of pieces of data that is larger than the end interval of the mapping unit to the end interval of the mapping unit. The second mapping unit is configured to map a plurality of mapping units to the second group of intervals respectively to determine the second average value of the mapped data according to a corresponding mapping unit.

In some embodiments, the execution unit 410 includes: a difference determining unit, a truncation threshold determining unit, a truncation unit, and a scale value determining unit. The difference determining unit is configured to determine a plurality of differences related to the plurality of mapping units based on the first average value and the plurality of second average values. The truncation threshold determining unit is configured to determine a truncation threshold for the plurality of pieces of data based on the plurality of differences. The truncation unit configured to truncate the plurality of pieces of data obtained based on the truncation threshold. The scale value determining unit configured to determine a scale value related to the mapping units based on the truncation threshold.

In some embodiments, the execution unit 410 further includes a scale unit that is configured to scale the plurality of truncated data based on the scale value.

In some embodiments, the device further includes an interval determining unit configured to determine the first group of intervals related to the plurality of pieces of data based on a maximum absolute value of the data.

In some embodiments, the first average value determining unit 406 includes an absolute value and number determining unit configured to determine the absolute value of the data in the plurality of pieces of data and the number of the plurality of pieces of data; a second average value determining unit configured to determine the average value based on the absolute value of the data in the plurality of pieces of data and the number of the plurality of pieces of data.

In some embodiments, the first average value determining unit 406 includes a first intermediate value and number determining unit configured to determine the intermediate value of each interval and the amount of data in each interval in the first group of intervals; and a third average value determining unit configured to determine the average value based on the intermediate value and the number.

In some embodiments, the first average value determining unit 406 includes: a second intermediate value and number determining unit configured to determine the number of data located in each interval of the mapping units and the intermediate value of each interval; and a fourth average value determining unit configured to determine the first average value based on the number and the intermediate value.

In some embodiments, the number of intervals in the second group of intervals is determined based on the number of bits related to the second data format.

It should be understood that the foregoing device embodiments are only illustrative, and the device of the present disclosure may also be implemented in other ways. For example, the division of the units/modules in the foregoing embodiment is only division of logical function, and there may be other division methods in actual implementation. For example, a plurality of units, modules, or components may be combined together or integrated into another system, or some features may be ignored or not implemented.

In addition, unless specified, each functional units/modules in each embodiments of the present disclosure may be integrated into one unit/module. Alternatively, each unit/module may exist alone physically, or two or more units/modules may be integrated together. The above-mentioned integrated units/modules can be implemented in the form of hardware or in the form of software program units.

When the above-mentioned integrated units/modules are implemented in the form of hardware, the hardware may be a digital circuit, an analog circuit, etc. Physical implementation of the hardware structure may include, but is not limited to, a transistor, a memristor, etc. Unless specified, the artificial intelligence processor may be any appropriate hardware processor, such as a CPU, a GPU, an FPGA, a DSP, an ASIC, etc. Unless specified, the storage unit may be any suitable magnetic storage medium or magneto-optical storage medium, such as an RRAM (resistive random-access memory), a DRAM (dynamic random access memory), a SRAM (static random-access memory), an EDRAM (enhanced dynamic random access memory), an HBM (high-bandwidth memory), an HMC (hybrid memory cube), etc.

If the integrated units/modules are implemented in the form of software program units and sold or used as an independent product, they can be stored in a computer-readable memory. Based on such understanding, the essence of the technical solutions of the present disclosure, or a part of the present disclosure that contributes to the prior art, or all or part of the technical solutions can be embodied in the form of a software product. The software product is stored in a memory, which includes several instructions to enable a computer device (which may be a personal computer, a server, or a network device, etc.) to perform all or part of the steps of the methods described in each embodiment of the present disclosure.

The foregoing memory includes: a USB flash drive, a read-only memory (ROM), a random access memory (RAM), a mobile hard disk, a magnetic disk or an optical disc, and other media that can store program codes.

In a possible implementation, an artificial intelligence chip including the above-mentioned data processing device is disclosed.

In a possible implementation, a board card is disclosed. The board card includes a storage device, an interface device, a control device, and the above mentioned artificial intelligence chip, where the artificial intelligence chip is connected to the storage device, the control device and the interface devices respectively. The storage device is used to store data; the interface device is used to realize data transmission between the artificial intelligence chip and the external device; and the control device is used to monitor state of the artificial intelligence chip.

Figure 5:
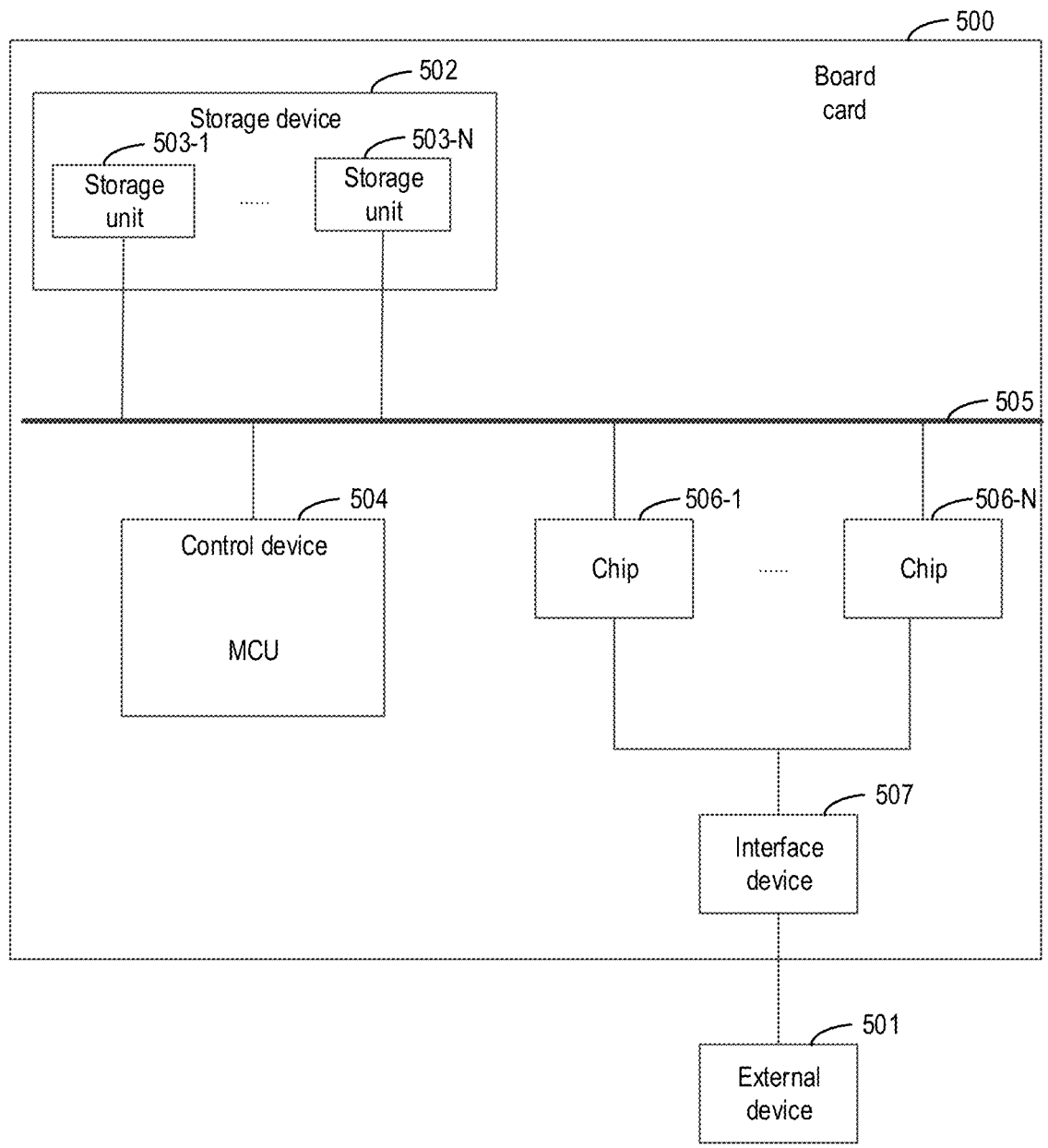
FIG. 5 illustrates a structural diagram of a board card 500 according to an embodiment of the present disclosure.

FIG. 5 shows a structural block diagram of a board card 500 according to an embodiment of the present disclosure. Referring to FIG. 5, the board card may include other supporting components in addition to the chip 506-1-506-$n$ (where N is a positive integer and can be collectively referred to as chip 506 for ease of description). The supporting components include but are not limited to: a storage device 502, an interface device 507 and a control device 504.

The storage device 502 is connected to the artificial intelligence chip through a bus 505 for storing data. The storage device may include a plurality of groups of storage units 503-1, . . . , 503-N, where N is a positive integer. The storage units may be collectively referred to as storage units 503 for ease of description. Each group of the storage units 503 and the artificial intelligence chip 506 are connected by the bus 505. It can be understood that each group of the storage units 503 may be a double data rate synchronous dynamic random-access memory (DDR SDRAM).

DDR does not need to increase the clock frequency to double the speed of SDRAM. DDR allows data to be read on the rising and falling edges of the clock pulse. The speed of DDR is twice that of a standard SDRAM. In an embodiment, the memory device may include 4 groups of storage units. Each group of storage units may include a plurality of DDR4 particles (chips). In an embodiment, the artificial intelligence chip may include four 72-bit DDR4 controllers. In the 72-bit DDR4 controller, 64 bits are used for data transmission and 8 bits are used for ECC verification. It can be understood that when each group of the storage units adopts DDR4-3200 particles, the theoretical bandwidth of data transmission may reach 25600 MB/s.

In an embodiment, each group of the storage units include a plurality of DDR SDRAMs arranged in parallel. DDR can transfer data twice per clock cycle. A DDR controller may be arranged inside the chip to control the data transmission and data storage of each storage unit.

The interface device 507 is electrically connected to the artificial intelligence chip 506. The interface device 507 is used to implement data transmission between the artificial intelligence chip and an external device 501 (for example, a server or a computer). For example, in an embodiment, the interface device 507 may be a standard PCIe interface. For example, the data to be processed is transmitted from the server to the chip through a standard PCIe interface to realize data transmission. In some embodiments, when the PCIe 3.0×16 interface is used for transmission, the theoretical bandwidth can reach 16000 MB/s. In another embodiment, the interface device 507 may also be other interfaces. The present disclosure does not limit the specific manifestations of other interfaces mentioned above, and the interface unit only needs to be able to realize the switching function. In addition, the calculation result of the artificial intelligence chip 506 is still transmitted by the interface device 507 back to the external device 501 (for example, a server).

The control device 504 is electrically connected to the artificial intelligence chip 506. The control device 504 is used to monitor the state of the artificial intelligence chip 506. Specifically, the artificial intelligence chip 506 and the control device 504 may be electrically connected through an SPI interface. The control device may include a micro controller unit (MCU). For example, the artificial intelligence chip 506 may include a plurality of processing chips, a plurality of processing cores, or a plurality of processing circuits, and can drive a plurality of loads. Therefore, the artificial intelligence chip 506 can be in different working states such as multi-load and light-load. The working state of the plurality of processing chips, the plurality of processing cores, or the plurality of processing circuits can be regulated and controlled by the control device.

In a possible implementation, an electronic device including the above-mentioned artificial intelligence chip is disclosed. The electronic device includes a data processing device, a robot, a computer, a printer, a scanner, a tablet computer, a smart terminal, a mobile phone, a traffic recorder, a navigator, a sensor, a webcam, a server, a cloud-based server, a camera, a video camera, a projector, a watch, a headphone, a mobile storage, a wearable device, a vehicle, a household appliance, and/or a medical device.

The vehicle includes an airplane, a ship, and/or a car; the household electrical appliance may include a television, an air conditioner, a microwave oven, a refrigerator, an electric rice cooker, a humidifier, a washing machine, an electric lamp, a gas cooker, and a range hood. The medical device may include a nuclear magnetic resonance spectrometer, a B-ultrasonic scanner, and/or an electrocardiograph.

In the above-mentioned embodiments, descriptions of each embodiment have their own emphasis. For parts that are not described in detail in an embodiment, reference may be made to related descriptions of other embodiments. The technical features of the above embodiments can be combined arbitrarily. In order to make the description concise, all possible combinations of the technical features in the above embodiments are not described. However, as long as there is no contradiction in the combination of these technical features, they should be considered in the range described in this specification.

The foregoing contents can be better understood according to the following articles:

Article A1, a method for processing data, comprising: obtaining a plurality of pieces of data for a machine learning model, where the data is represented in a first data format; distributing the plurality of pieces of data in the first group of intervals based on the value of the plurality of pieces of data, where the number of the first group of intervals is predetermined; determining a first average value of the plurality of pieces of data; mapping the data distributed in the first group of intervals into a second group of intervals according to a plurality of different mapping units so as to determine a second average value of the mapped data according to a corresponding mapping unit, where the mapping unit includes a predetermined number of consecutive intervals starting from the first interval of the first group of intervals, where the end interval of the mapping unit is distributed with data larger than or located in the end interval of the plurality of pieces of data, the number of intervals in the second group of intervals is related to the second data format, and the accuracy of the second data format is lower than that of the first data format; and processing the plurality of pieces of data based on the first average value and a plurality of second average values, so that the processed plurality of pieces of data is represented in the second data format.

Article A2, the method of article A1, where mapping the data distributed in the first group of intervals to the second group of intervals according to the plurality of different mapping units includes: redistributing data in the plurality of pieces of data that is larger than the end interval of the mapping unit to the end interval of the mapping unit; and mapping a plurality of mapping units to the second group of intervals respectively to determine the second average value of the mapped data according to the corresponding mapping unit.

Article A3, the method of clause A1, where processing the plurality of pieces of data includes: determining a plurality of differences related to the plurality of mapping units based on the first average value and the plurality of second average values; determining a truncation threshold used for the plurality of pieces of data based on the plurality of differences; truncating the obtained plurality of pieces of data based on the truncation threshold; and determining a scale value related to the mapping unit based on the truncation threshold.

Article A4, the method of article A1, where processing the plurality of pieces of data further comprises: scaling the truncated plurality of pieces of data based on the scale value.

Article A5, the method of article A1, further comprising: determining the first group of intervals related to the plurality of pieces of data based on a maximum absolute value of the data.

Article A6, the method of article A1, where determining the first average value of the plurality of pieces of data includes: determining the absolute value of the data in the plurality of pieces of data and the number of the plurality of pieces of data; and determining the average value based on the absolute value of the data in the plurality of pieces of data and the number of the plurality of pieces of data.

Article A7, the method of article A1, where determining the first average value of the plurality of pieces of data includes: determining an intermediate value of each interval in the first group of intervals and the amount of data in each interval; and determining the average value based on the intermediate value and the number.

Article A8, the method of article A1, where determining the first average value of the plurality of pieces of data includes: determining the amount of data in each interval of the mapping unit and the intermediate value of each interval; and determining the first average value based on the number and the intermediate value.

Article A9, the method of article A1, where the number of intervals in the second group of intervals is determined based on the number of bits related to the second data format.

Article A10, a device for processing data, comprising: an acquisition unit configured to acquire a plurality of pieces of data for a machine learning model, where the data is represented in a first data format;

a distribution unit configured to distribute the plurality of pieces of data in the first group of intervals based on values of the plurality of pieces of data, where the number of the first group of intervals is predetermined; a first average value determining unit configured to determine the first average value of the plurality of pieces of data; a first mapping unit configured to map the data distributed in the first group of intervals to the second group of intervals according to a plurality of different mapping units to determine a second average value of the mapped data according to the corresponding mapping unit, where the mapping unit includes a predetermined number of consecutive intervals starting from the first interval of the first group of intervals, where the end interval of the mapping unit is distributed with data larger than or located in the end interval of the plurality of pieces of data, the number of intervals in the second group of intervals is related to the second data format, and the accuracy of the second data format is lower than that of the first data format; and an execution unit configured to process on the plurality of pieces of data based on the first average value and the plurality of second average values, so that the processed plurality of pieces of data is represented in the second data format.

Article A11, the device of article A10, where the first mapping unit includes: a redistribution unit configured to redistribute data in the plurality of pieces of data that is greater than the end interval of the mapping unit to the end interval of the mapping unit; and a second mapping unit configured to map a plurality of mapping units to the second group of intervals respectively to determine the second average value of the mapped data according to a corresponding mapping unit.

Article A12, the device of article A10, where the execution unit includes: a difference determining unit configured to determine a plurality of differences related to the plurality of mapping units based on the first average value and the plurality of second average values; a truncation threshold determining unit configured to determine a truncation threshold for the plurality of pieces of data based on the plurality of differences; a truncation unit configured to truncate the obtained plurality of pieces of data based on the truncation threshold; and a scale value determining unit configured to determine a scale value related to the mapping unit based on the truncation threshold.

Article A13, the device of article A12, where the execution unit further includes a scale unit configured to scale the truncated plurality of pieces of data based on the scale value.

Article A14, the device of article A10, further comprising: an interval determining unit configured to determine the first group of intervals related to the plurality of pieces of data based on the maximum absolute value of the data.

Article A15, the device of article A10, where the first average value determining unit includes: an absolute value and number determining unit configured to determine the absolute value of the data in the plurality of pieces of data and the number of the plurality of pieces of data; and a second average value determining unit configured to determine the average value based on the absolute value of the data in the plurality of pieces of data and the number of the plurality of pieces of data.

Article A16, the device of article A10, where the first average value determining unit includes: a first intermediate value and number determining unit configured to determine an intermediate value of each interval in the first group of intervals and the amount of data in each interval; and a third average value determining unit configured to determine the average value based on the intermediate value and the number.

Article A17, the device of A10, where the first average value determining device includes: a second intermediate value and number determining unit configured to determine the number of data located in each interval of the mapping unit and the intermediate value of each interval; and a fourth average value determining unit configured to determine the first average value based on the number and the intermediate value.

Article A18. The device of article A10, where the number of intervals in the second group of intervals is determined based on the number of bits related to the second data format.

Article A19, an artificial intelligence chip, comprising a processor and a memory, where the memory stores computer program instructions, and the processor runs the computer program instructions in the memory to control the artificial intelligence chip to execute any one of methods of article A1-A9.

Article A20, an electronic device, comprising the artificial intelligence chip of Article A19.

Article A21, a board card, comprising: a storage device, an interface device, a control device, and the artificial intelligence chip of article A19, where the artificial intelligence chip is respectively connected to the storage device, the control device and the interface device; the storage device is used to store data; the interface device is used to realize data transmission between the artificial intelligence chip and the external device; and the control device is used to monitor state of the artificial intelligence chip.

Article A22, the board card of article A21, where the memory device comprises a plurality of groups of storage units, where each group of the storage units is connected to the artificial intelligence chip through a bus, and the storage unit is: DDR SDRAM; the artificial intelligence chip includes: a DDR controller configured to control the data transmission and data storage of each storage unit; and the interface device is a standard PCIe interface.

The embodiments of the present disclosure are described in detail above, and specific examples are used to illustrate principles and implementations of the present disclosure. The descriptions of the above embodiments are only used to help understand the methods and core ideas of the present disclosure. Persons of ordinary skill in the art may change or transform the implementation and application scope according to the ideas of the present application. The changes and transformations shall all fall within the protection scope of the present disclosure. In summary, the content of this specification should not be construed as a limitation on the present disclosure.

The invention claimed is:

1. A method for processing data, comprising:
    obtaining a plurality of pieces of data for a machine learning model, wherein the data is represented in a first data format;
    distributing the plurality of pieces of data in the first group of intervals based on the value of the plurality of pieces of data, wherein the number of the first group of intervals is predetermined;
    determining a first average value of the plurality of pieces of data;
    mapping the data distributed in the first group of intervals into a second group of intervals according to a plurality of different mapping units so as to determine a second average value of the mapped data according to a corresponding mapping unit, wherein the mapping unit includes a predetermined number of consecutive intervals starting from the first interval of the first group of intervals, and the ending interval of the mapping unit is distributed with the plurality of pieces of data that is larger than or located in the end interval;
    the number of intervals in the second group of intervals is related to the second data format, and the accuracy of the second data format is lower than that of the first data format; and
    processing the plurality of pieces of data based on the first average value and a plurality of second average values, so that the processed plurality of pieces of data is represented in the second data format.

2. The method of claim 1, wherein the mapping the data distributed in the first group of intervals to the second group of intervals according to the plurality of different mapping units includes:
    redistributing data in the plurality of pieces of data that is larger than the end interval of the mapping unit to the end interval of the mapping unit; and
    mapping a plurality of mapping units to the second group of intervals respectively to determine the second average value of the mapped data according to the corresponding mapping unit.

3. The method of claim 1, wherein the processing the plurality of pieces of data includes:
    determining a plurality of differences related to the plurality of mapping units based on the first average value and the plurality of second average values;
    determining a truncation threshold used for the plurality of pieces of pieces of data based on the plurality of differences;
    truncating the obtained plurality of pieces of data based on the truncation threshold; and
    determining a scale value related to the mapping unit based on the truncation threshold.

4. The method of claim 3, wherein the processing the plurality of pieces of data further comprises:
    scaling the truncated plurality of pieces of data based on the scale value.

5. The method of claim 1, further comprising:
    determining the first group of intervals related to the plurality of pieces of data based on a maximum absolute value of the data.

6. The method of claim 1, wherein the determining the first average value of the plurality of pieces of data includes:
    determining the absolute value of the data in the plurality of pieces of data and the number of the plurality of pieces of data; and determining the average value based on the absolute value of the data in the plurality of pieces of data and the number of the plurality of pieces of data.

7. The method of claim 1, wherein the determining the first average value of the plurality of pieces of data includes:
determining an intermediate value of each interval in the first group of intervals and the amount of data in each interval; and
determining the average value based on the intermediate value and the number.

8. The method of claim 1, wherein the determining the first average value of the plurality of pieces of data includes:
determining the amount of data in each interval of the mapping unit and the intermediate value of each interval; and
determining the first average value based on the number and the intermediate value.

9. The method of claim 1, wherein the number of intervals in the second group of intervals is determined based on the number of bits related to the second data format.

10. An artificial intelligence chip, comprising:
a processor and
a memory, wherein the memory stores computer program instructions, and the processor runs the computer program instructions in the memory to control the artificial intelligence chip to execute the method of claim 1.

11. A device for processing data, comprising:
an acquisition circuit configured to acquire the plurality of pieces of data for a machine learning model, wherein the data is represented in a first data format;
a distribution circuit configured to distribute the plurality of pieces of data in the first group of intervals based on values of the plurality of pieces of data, wherein the number of the first group of intervals is predetermined;
a first average value determining circuit configured to determine the first average value of the plurality of pieces of data;
a first mapping circuit configured to map the data distributed in the first group of intervals to the second group of intervals according to a plurality of different mapping circuits to determine a second average value of the mapped data according to the corresponding mapping circuit, wherein the mapping circuit includes a predetermined number of consecutive intervals starting from the first interval of the first group of intervals, and the ending interval of the mapping circuit is distributed with the plurality of pieces of data that is larger than or located in the end interval; the number of intervals in the second group of intervals is related to the second data format, and the accuracy of the second data format is lower than that of the first data format; and
an execution circuit configured to process on the plurality of pieces of data based on the first average value and the plurality of second average values, so that the processed plurality of pieces of data is represented in the second data format.

12. The device of claim 11, wherein the first mapping circuit includes:
a redistribution circuit configured to redistribute data in the plurality of pieces of data that is greater than the end interval of the mapping circuit to the end interval of the mapping circuit; and
a second mapping circuit configured to map the plurality of different mapping circuits to the second group of intervals respectively to determine the second average value of the mapped data according to a corresponding mapping circuit.

13. The device of claim 11, wherein the execution circuit includes:
a difference determining circuit configured to determine a plurality of difference values related to the plurality of mapping circuits based on the first average value and the plurality of second average values;
a truncation threshold determining circuit configured to determine a truncation threshold for the plurality of pieces of data based on the plurality of differences;
a truncation circuit configured to truncate the obtained plurality of pieces of data based on the truncation threshold; and
a scale value determining circuit configured to determine a scale value related to the mapping circuit based on the truncation threshold.

14. The device of claim 13, wherein the execution circuit further includes
a scale circuit configured to scale the truncated plurality of pieces of data based on the scale value.

15. The device of claim 11, further comprising
an interval determining circuit configured to determine the first group of intervals related to the plurality of pieces of data based on the maximum absolute value of the data.

16. The device of claim 11, wherein the first average value determining circuit includes:
an absolute value and number determining circuit configured to determine the absolute value of the data in the plurality of pieces of data and the number of the plurality of pieces of data; and
a second average value determining circuit configured to determine the average value based on the absolute value of the data in the plurality of pieces of data and the number of the plurality of pieces of data.

17. The device of claim 11, wherein the first average value determining circuit includes:
a first intermediate value and number determining circuit configured to determine an intermediate value of each interval in the first group of intervals and the amount of data in each interval; and
a third average value determining circuit configured to determine the average value based on the intermediate value and the number.

18. The device of claim 11, wherein the first average value determining device includes:
a second intermediate value and number determining circuit configured to determine the number of data located in each interval of the mapping circuit and the intermediate value of each interval; and
a fourth average value determining circuit configured to determine the first average value based on the number and the intermediate value.

19. The device of claim 11, wherein the number of intervals in the second group of intervals is determined based on the number of bits related to the second data format.

* * * * *